United States Patent
Noda et al.

(10) Patent No.: US 8,165,478 B2
(45) Date of Patent: Apr. 24, 2012

(54) OPTICAL RECEIVER

(75) Inventors: Masaki Noda, Tokyo (JP); Masamichi Nogami, Tokyo (JP); Junichi Nakagawa, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 468 days.

(21) Appl. No.: 12/516,574

(22) PCT Filed: Dec. 21, 2006

(86) PCT No.: PCT/JP2006/325485
§ 371 (c)(1),
(2), (4) Date: May 28, 2009

(87) PCT Pub. No.: WO2008/075430
PCT Pub. Date: Jun. 26, 2008

(65) Prior Publication Data
US 2010/0067924 A1  Mar. 18, 2010

(51) Int. Cl.
*H04B 10/06* (2006.01)

(52) U.S. Cl. .................. 398/209; 398/208; 398/202

(58) Field of Classification Search .................. 398/209, 398/208, 202
See application file for complete search history.

(56) References Cited

U.S. PATENT DOCUMENTS

| | | | |
|---|---|---|---|
| 2004/0128137 A1* | 7/2004 | Bush et al. | 704/275 |
| 2009/0252504 A1* | 10/2009 | Noda et al. | 398/202 |

FOREIGN PATENT DOCUMENTS

| | | |
|---|---|---|
| DE | 102 23 964 B3 | 1/2004 |
| JP | 1 47134 | 2/1989 |
| JP | 3 162115 | 7/1991 |
| JP | 6 53765 | 2/1994 |
| JP | 6 216954 | 8/1994 |
| JP | 8 51329 | 2/1996 |
| JP | 2000 183770 | 6/2000 |
| JP | 2005 20417 | 1/2005 |

OTHER PUBLICATIONS

Makoto Nakamura, et al., "A 156-Mb/s CMOS Optical Receiver for Burst-Mode Transmission", IEEE Journal of Solid-State Circuits, vol. 33, No. 8, XP011060790, Aug. 1, 1998, pp. 1179-1187.

* cited by examiner

*Primary Examiner* — Kinam Park
(74) *Attorney, Agent, or Firm* — Oblon, Spivak, McClelland, Maier & Neustadt, L.L.P.

(57) ABSTRACT

An optical receiver of wide-dynamic range characteristic that stably reproduces a burst signal having different light receiving levels. A preamplifier converts an output from a light receiving element into a voltage signal. A level detecting circuit includes: a first level detecting unit having a shorter time constant; and a second level detecting unit having a longer time constant and switching over to any of the level detecting units in response to a time constant switching signal to detect a voltage level of an output voltage signal output from the preamplifier. An amplifier variably controls conversion gain of the preamplifier based on the detecting result. A time constant switching control outputs the time constant switching signal to the level detecting unit based on the output voltage signal from the preamplifier, to select the first level detecting unit or the second detecting unit based on a number of consecutive identical digits being equal to, smaller, or larger than the predetermined number.

12 Claims, 15 Drawing Sheets

OPTICAL RECEIVER

TECHNICAL FIELD

The present invention relates to an optical communication system, and more specifically, to an optical receiver which is employed in a passive optical network (PON) system as one of access optical communication systems.

BACKGROUND ART

Conventionally, "point-to-multi-point" access optical communication systems called passive optical network (PON) systems have been widely employed as systems capable of realizing public networks using optical fibers.

A PON system includes one optical line terminal (OLT) which is a station-side apparatus, and optical network units (ONUs) which correspond to a plurality of subscriber terminal apparatuses and are connected via an optical star coupler to the OLT. Currently, the PON systems have been actively introduced in order to realize broadband networks from the following merits: a major portion of optical fibers corresponding to transmission paths can be commonly used with the OLT by a large number of ONUs, and hence lower operation cost can be expected; an optical star coupler corresponding to a passive component has no need for power feeding and thus can be easily set outdoors; and reliability thereof is high.

For instance, in Gigabit Ethernet-passive optical network (GE-PON) having a transmission speed of 1.25 Gbit/s, which is standardized in IEEE 802.3ah, in a downlink from an OLT to ONUs, there is employed a broadcast communication system using an optical wavelength of 1.49 µm band, and the respective ONUs derive only data of the allocated time slots. On the other hand, in an uplink from the respective ONUs to the OLT, an optical wavelength of 1.31 µm band is employed, and a time division multiplexing communication system is employed by which transmission timing is controlled in order that data of the respective ONUs do not collide with each other.

In uplink communication of the above-mentioned PON system, the respective ONUs are located at different distances from the optical star coupler, and hence reception levels of the respective ONUs in the OLT are different for every reception packet. As a result, a wide-dynamic range characteristic capable of stably reproducing packets which have different light receiving levels is required for a receiving circuit of the OLT. As a consequence, generally speaking, there is provided an automatic gain control (AGC) circuit, which changes a conversion gain in response to a light receiving level, in a receiving circuit of an OLT, and the AGC is required to make high-speed response with long consecutive identical digit signals compatible.

Various types of AGC circuits have been proposed. For example, according to Patent Document 1, a feedback resistance value of a preamplifier, that is, a conversion gain thereof is switched stepwise based on a light receiving level. According to Patent Document 2 which is a conventional technology referred to in Patent Document 1, the feedback resistance value of the preamplifier, that is, the conversion gain thereof is changed in an analog manner based on the light receiving level.

Patent Document 1: JP 2000-151290 A
Patent Document 2: JP 07-38342 A

DISCLOSURE OF THE INVENTION

Problems to be Solved by the Invention

The technology described in Patent Document 1 has an advantage in which high-speed response with long consecutive identical digit signals can be compatible with each other because an AGC operation is completed with the initial several bits of a packet and a constant gain is continuously maintained irrespective of a pattern string of a received signal after the completion of the AGC operation. However, this is a system for controlling the gain based on the amplitude of a first bit of the packet. Therefore, when a received burst signal has a transient level variation, particularly, when the burst signal converges to a constant level after excessive light emission, there is a problem that the conversion gain is switched to an erroneous gain.

In the technology described in Patent Document 2, it is necessary to shorten a time constant of an AGC loop in order to realize the high-speed responsiveness. However, in such a case, the conversion gain is likely to depend on the pattern string of the received signal, thereby degrading the identical code continuation resistance. That is, there is a problem that the compatibility between the high-speed responsiveness and the identical code continuation resistance is difficult.

The present invention has been made in view of the points described above, and an object of the present invention is to provide an optical receiver which has a wide-dynamic range characteristic to stably reproduce a burst signal having different light receiving levels mainly in a PON system which is one of access optical communication systems, and which is excellent in the high-speed responsiveness and the identical code continuation resistance.

Means for Solving the Problems

An optical receiver according to the present invention includes: a light receiving element for outputting a current corresponding to a light receiving level of a received light signal; a preamplifier for converting an output current signal from the light receiving element into a voltage signal; level detecting means including: a first level detecting unit having a short time constant; and a second level detecting unit having a time constant longer than the time constant of the first level detecting unit, the level detecting means switching over to any one of the first level detecting unit and the second level detecting unit in response to a time constant switching signal to detect a voltage level of an output voltage signal output from the preamplifier; conversion gain control means for variably controlling a conversion gain of the preamplifier based on a result obtained by the detecting by the level detection means; and time constant switching control means for outputting the time constant switching signal based on the output voltage signal from the preamplifier, in which the time constant switching control means outputs the time constant switching signal to the level detecting means so as to select the first level detecting unit when a number of consecutive identical digits of a bit string of a packet of a received burst signal is smaller than a predetermined number, and so as to select the second level detecting unit when the number of consecutive identical digits is equal to or larger than the predetermined number.

EFFECTS OF THE INVENTION

According to the present invention, the optical receiver includes: the preamplifier capable of changing the conversion gain; the level detecting means capable of switching the time constant; and the time constant switching control means for selecting the suitable time constant based on the received signal. In response to the time constant switching signal from the time constant switching control means, the control is performed so as to shorten the time constant of the level detecting means for the first part of the packet of the burst signal and the control is performed so as to lengthen the time constant of the level detecting means after the completion of the AGC operation of the preamplifier. The conversion gain of the preamplifier is controlled based on the result obtained by the detecting by the level detecting means controlled as described above. Therefore, it is possible to realize the optical receiver which has a wide-dynamic range characteristic to stably reproduce a packet having different light receiving levels and which is excellent in high-speed response with long consecutive identical digit signals.

BEST MODE FOR CARRYING OUT THE INVENTION

Referring now to the accompanying drawings, a detailed description is made of optical receivers according to embodiments of the present invention. It should be noted that the present invention is not limited to the embodiments.

Embodiment 1

Figure 1:
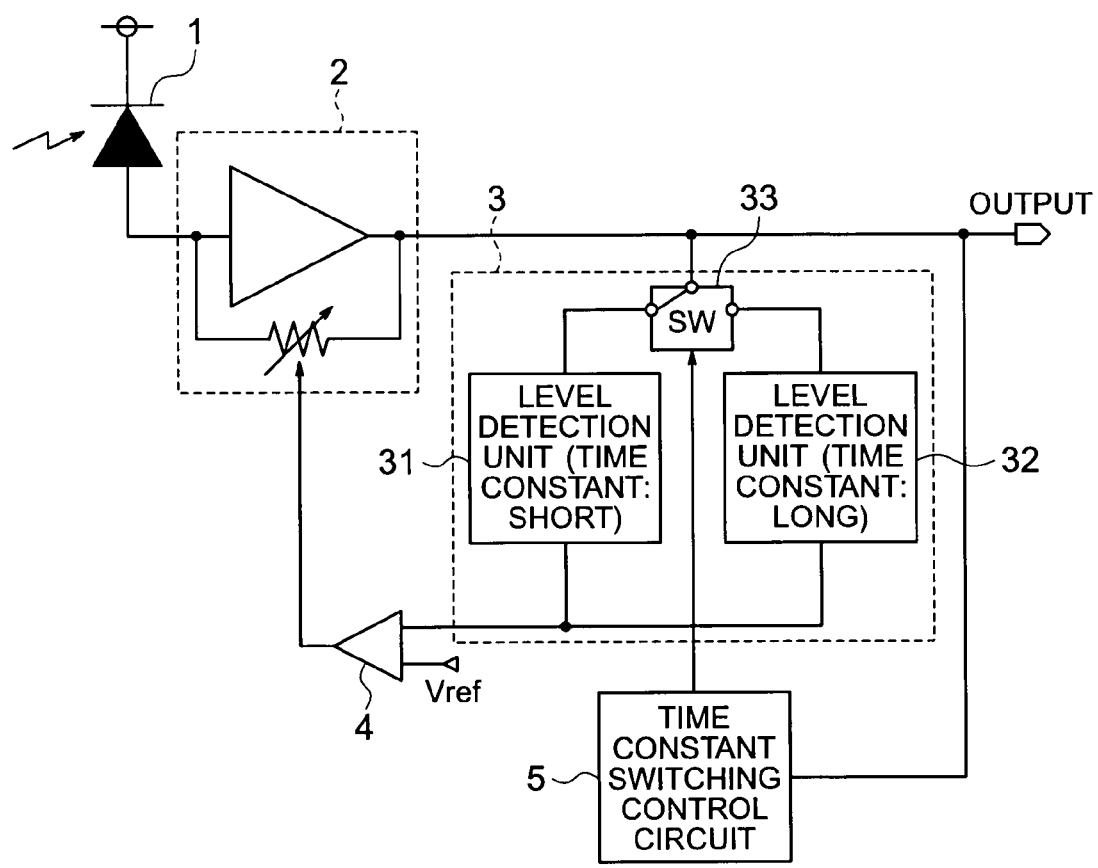
FIG. 1 A block diagram illustrating a structure of an optical receiver according to Embodiment 1 of the present invention.

FIG. 1 is a block diagram illustrating a structure of an optical receiver according to Embodiment 1 of the present invention. A light receiving element 1 has a cathode connected to a power supply and an anode connected to an input terminal of a preamplifier 2, and outputs a current corresponding to a light receiving level of a received optical signal.

The preamplifier 2 converts the current input from the light receiving element 1 into a voltage, outputs the converted voltage, and can change conversion efficiency for converting the current into the voltage in response to an input control voltage.

An average value of the voltage signal output from the preamplifier 2 is detected by a level detecting circuit 3. The level detecting circuit 3 includes: a level detecting unit 31 whose time constant is short; a level detecting unit 32 whose time constant is long, having a longer time constant than the time constant of the level detecting unit 31; and a time constant switching switch 33 for switching the time constant of the level detecting circuit 3.

An output voltage of the level detecting circuit 3 is amplified to a desired control voltage by an amplifier 4 serving as conversion gain control means to control the conversion gain of the preamplifier 2. A time constant switching control circuit 5 selects a suitable time constant based on a received electrical signal output from the preamplifier 2. When a number of consecutive identical digits of a bit string of a packet of a received burst signal is smaller than a predetermined number, the first level detecting unit is selected. When the number of consecutive identical digits is equal to or larger than the predetermined number, a time constant switching signal is input to the time constant switching switch 33 in order to select the second level detecting unit.

Note that the time constant switching switch 33 of the level detecting circuit 3 operates so as to connect to the level detecting unit 33 whose time constant is short during an AGC operation and connect to the level detecting unit 33 whose time constant is long when the AGC operation is completed.

Figure 2:
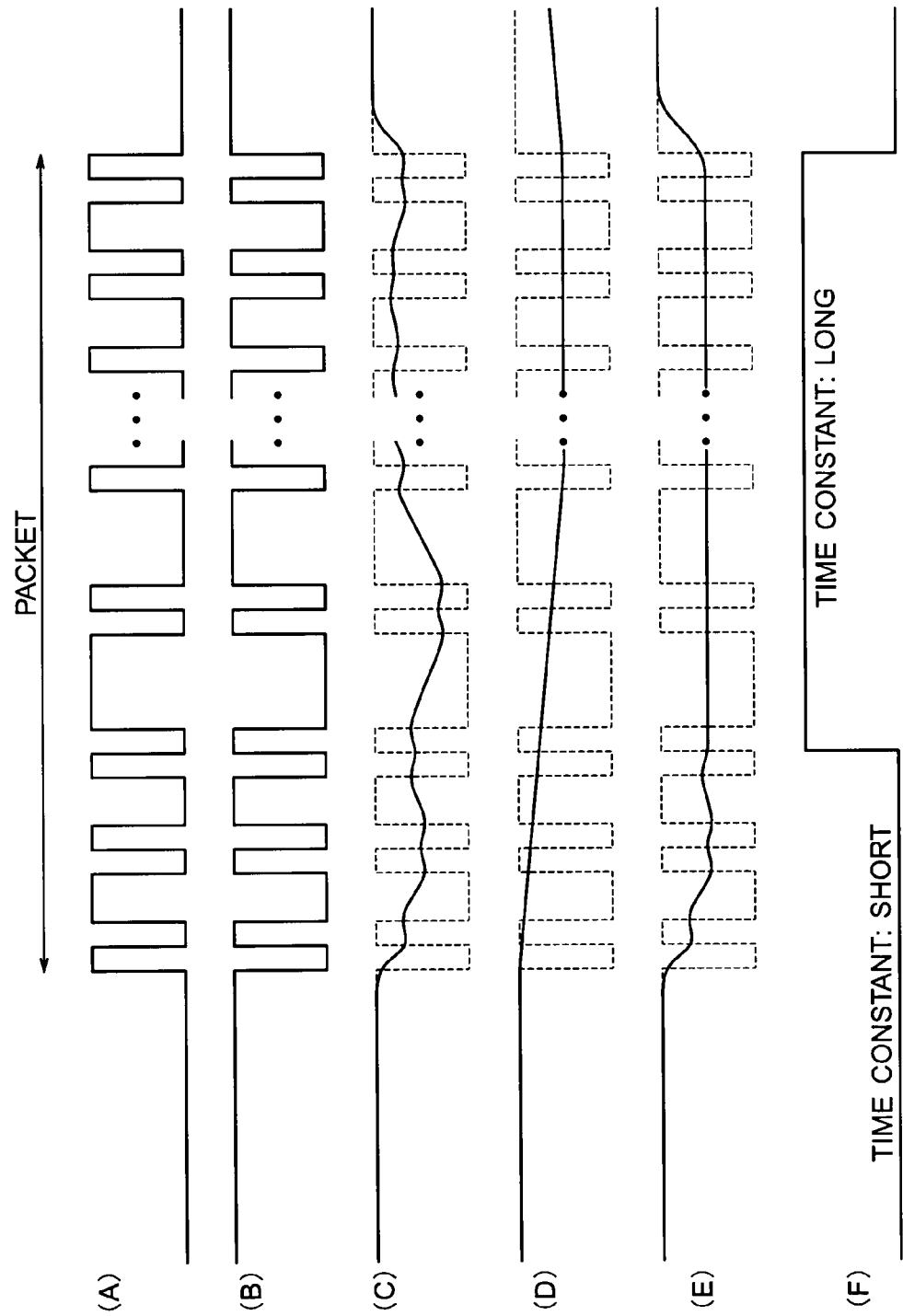
FIG. 2 A timing chart illustrating signal waveforms of respective units of FIG.

Next, FIG. 2 is a timing chart illustrating signal waveforms appearing in respective units of FIG. 1. (A) illustrates an output current of the light receiving element 1, (B) illustrates an output voltage of the preamplifier 2, (C) illustrates an output voltage of the level detecting circuit 3 in a case where the level detecting unit 31 whose time constant is short is continuously employed, (D) illustrates an output voltage of the level detecting circuit 3 in a case where the level detecting unit 32 whose time constant is long is continuously employed, (E) illustrates an output voltage of the level detecting circuit 3 in the case where the time constant switching switch 33 is switched based on a detection result of the time constant switching control circuit 5, and (F) illustrates a time constant switching signal output from the time constant switching control circuit 5. It should be noted that, in FIG. 2, the signal waveforms of (C), (D), and (E) are displayed by being superimposed on the signal waveform of (B) in order to clarify a relationship between those output voltages and the output voltage of the preamplifier 2.

A description is made of operations and a feature of the optical receiver according to Embodiment 1 of the present invention with reference to FIG. 2. In FIG. 2, (C) illustrates the output voltage of the level detecting circuit 3 when the level detecting unit 31 whose time constant is short is continuously employed. The time constant is short, and hence the level detecting unit 31 has an excellent high-speed responsiveness. To the contrary, when an identical code is continued, a level detecting error of the level detecting unit 31 becomes larger, and hence the level detecting unit 31 can hardly and constantly control the desired conversion gain.

On the other hand, in FIG. 2, (D) illustrates the output voltage of the level detecting circuit 3 when the level detecting unit 32 whose time constant is long is continuously employed. The time constant is long, and hence, even when the identical code is continued, the level detecting unit 32 can detect the levels thereof with high precision, and can constantly control the desired conversion gain. To the contrary, the level detecting unit 32 can have poor high-speed responsiveness, and hence the level detecting unit 32 is not suitable for receiving a burst signal.

In FIG. 2, (E) illustrates the output voltage of the level detecting circuit 3 in the case where the time constant of the level detecting circuit 3 is switched by the time constant switching switch 33 included in the level detecting circuit 3 based on the output voltage of the time constant switching control circuit 5. Only a first part of the packet of the burst signal is subjected to level detection with the short time constant and subsequent parts thereof are subjected to level detection with the long time constant.

In general, the packet of the burst signal includes: a preamble portion added to the first part of the packet in order to establish synchronization required for data transmission between a transmitter and a receiver; and a data portion for storing actual communication data. A maximum number of consecutive identical digits of an allowable bit string of the data portion is larger than that of the preamble portion.

Therefore, the preamble portion of the first part of the packet is subjected to the level detection with the short time constant until the AGC operation is completed, and hence the AGC operation is completed at high speed. After the completion of the AGC operation, the time constant for the level detection is switched to the long time constant. Thus, the data portion including a long identical code continuation bit string can be also subjected to highly precise and stable level detection.

As described above, the optical receiver according to Embodiment 1 of the present invention includes the preamplifier 2 capable of changing the conversion gain, the level detecting circuit 3 capable of switching the time constant, and the time constant switching control circuit 5 for selecting the suitable time constant based on the received signal. Based on a result obtained by detection by the time constant switching control circuit 5, the control is performed so as to shorten the time constant of the level detecting circuit 3 for the first part of the packet of the burst signal, and the control is performed so as to lengthen the time constant of the level detecting circuit 3 after the completion of the AGC operation of the preamplifier 2. The conversion gain of the preamplifier 2 is controlled based on a result obtained by detection by the level detecting circuit 3 controlled as described above. Therefore, it is possible to realize an optical receiver which has a wide-dynamic range characteristic to stably reproduce a packet having different light receiving levels and which is excellent in high-speed responsiveness and identical code continuation resistance.

Embodiment 2

Figure 3:
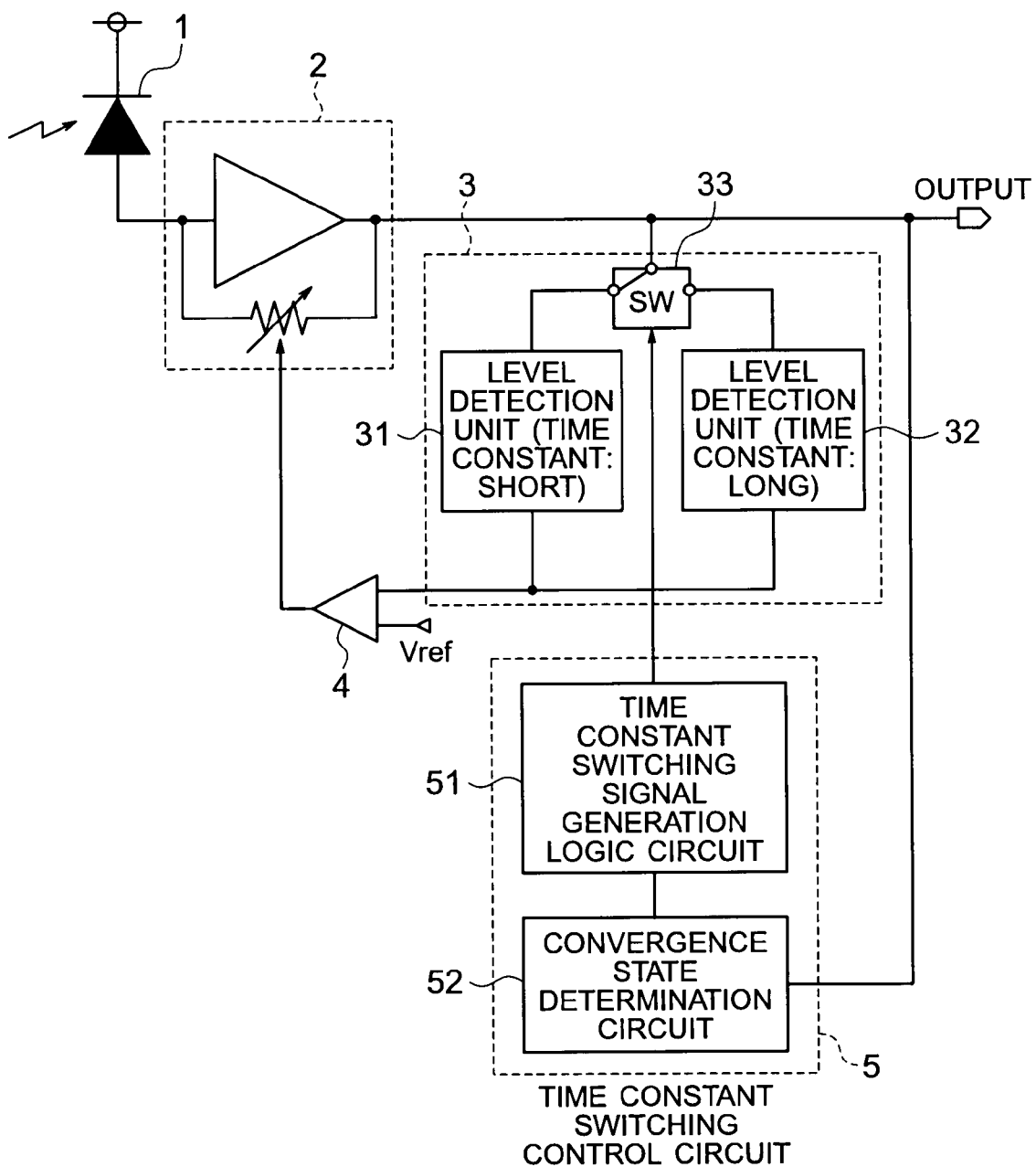
FIG. 3 A block diagram illustrating a structure of an optical receiver according to Embodiment 2 of the present invention.

FIG. 3 is a block diagram illustrating a structure of an optical receiver according to Embodiment 2 of the present invention. In the structure according to Embodiment 2 as illustrated in FIG. 3, the same units as the structure according to Embodiment 1 as illustrated in FIG. 1 are expressed by the same symbols and thus the description is omitted. The structure of the time constant switching control circuit 5 is different from that in Embodiment 1. In the structure according to Embodiment 2 as illustrated in FIG. 3, the time constant switching control circuit 5 includes: a convergence state determination circuit 51; and a time constant switching signal generation logic circuit 52 for generating the time constant switching signal based on a result obtained by determination by the convergence state determination circuit 51.

Figure 4:
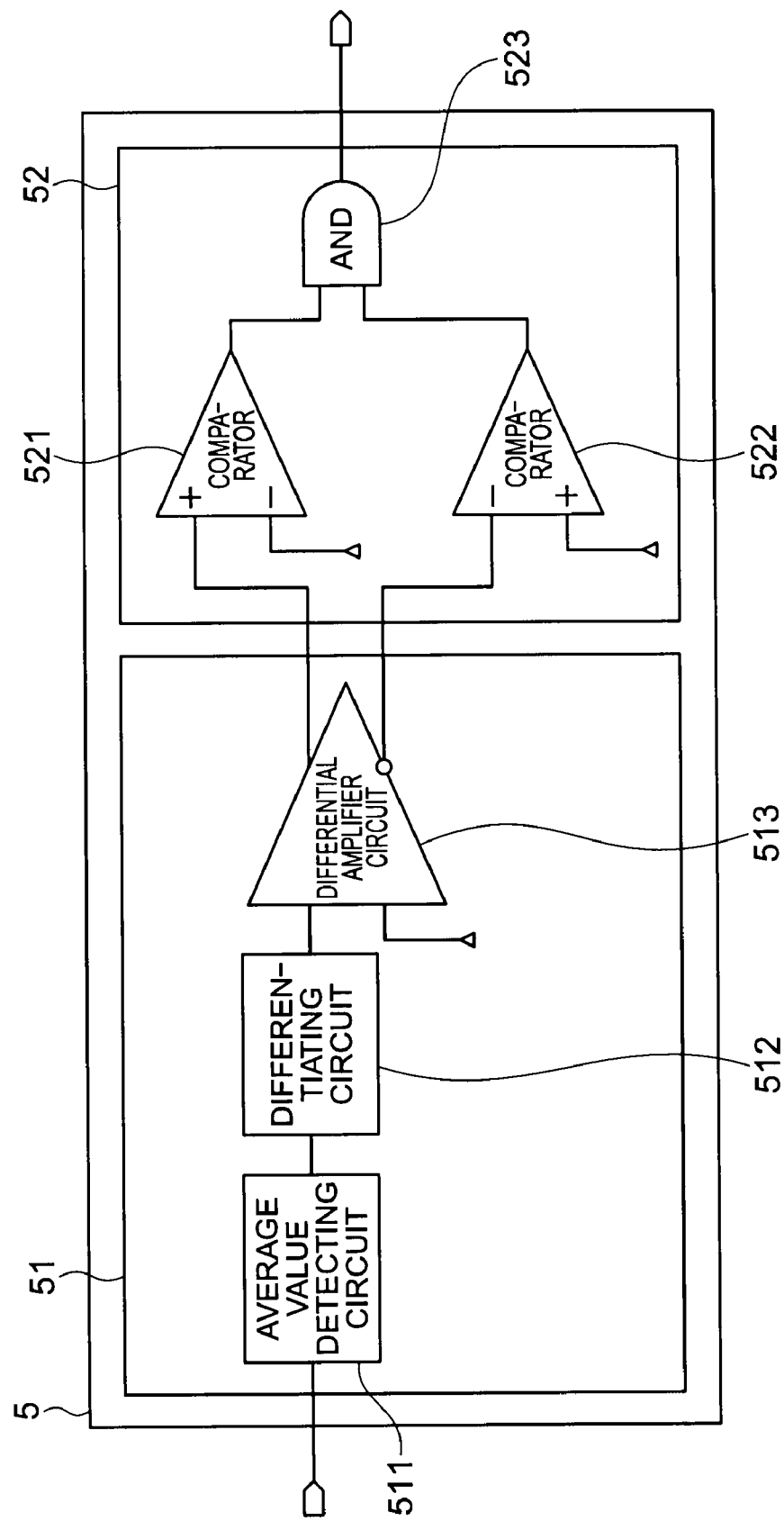
FIG. 4 A block diagram illustrating specific structural examples of a convergence state determination circuit 51 and a time constant switching signal generation logic circuit 52 illustrated in FIG. 3.

FIG. 4 is a block diagram illustrating specific structural examples of the convergence state determination circuit 51 and the time constant switching signal generation logic circuit 52. The convergence state determination circuit 51 includes an average value detecting circuit 511 located at the input stage, and a differentiating circuit 512 and a differential amplifier circuit 513 which are located at the subsequent stages. The time constant switching signal generation logic circuit 52 includes two comparators 521 and 522 which are located at the input stages and which receive respective output signals from the differential amplifier circuit 513 located at the output stage of the convergence state determination circuit 51. Outputs of the comparators 521 and 522 are logically operated by an AND logic circuit 523 and a result obtained thereby is output. A time constant of the average value detecting circuit 511 is equal to the short time constant of the level detecting unit 31 of the level detecting circuit 3.

Figure 5:
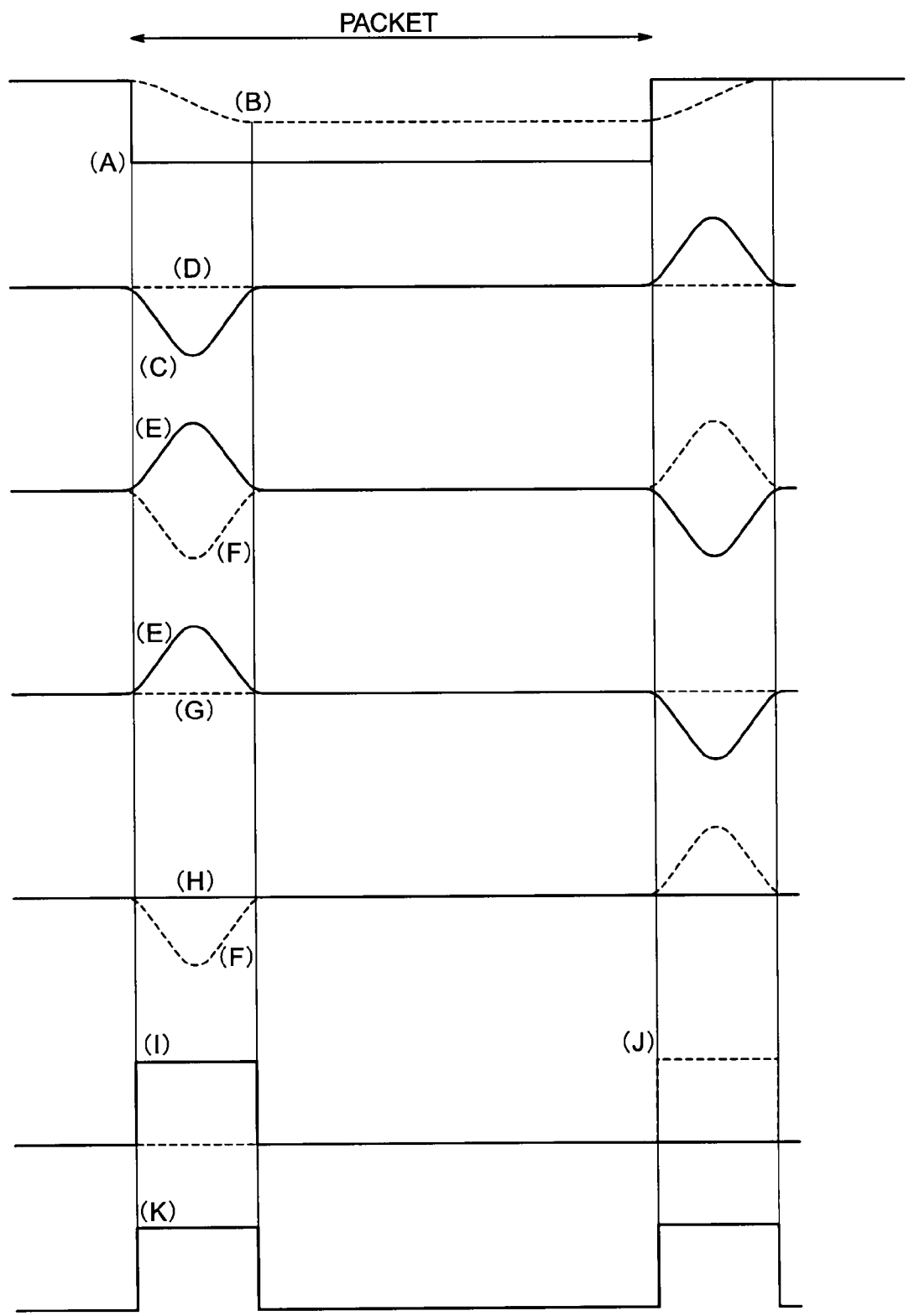
FIG. 5 A timing chart illustrating signal waveforms of respective units of FIG. 4.

FIG. 5 is a timing chart illustrating signal waveforms of the respective units of FIG. 4. In FIG. 5, (A) illustrates an input signal of the average value detecting circuit 511, (B) illustrates an output signal of the average value detecting circuit 511, (C) illustrates an output signal of the differentiating circuit 512, (D) illustrates a reference voltage signal input to the differential amplifier circuit 513, (E) and (F) illustrate output signals of the differential amplifier circuit 513, (G) and (H) illustrate reference voltage signals for the comparators 521 and 522, (I) illustrates an output signal of the comparator 521, (J) illustrates an output signal of the comparator 522, and (K) illustrates an output signal of the AND logic circuit 523.

The operation and feature of the optical receiver according to Embodiment 2 of the present invention are described with reference to FIG. 5.

In FIG. 5, in a case where the output signal (B) of the average value detecting circuit 511 changes, that is, in a case of only a transient state in which the signal does not converge to a constant voltage, the output signal (C) of the differentiating circuit 512 has an output amplitude corresponding to a temporal change rate of the output signal (B) of the average value detecting circuit 511. A voltage value of the reference voltage signal (D) for the differential amplifier circuit 513 is made equal to an output value of the output signal (C) of the differentiating circuit 512 in the case where the output signal (B) of the average value detecting circuit 511 is converged. The output signal (C) of the differentiating circuit 512 is amplified by the differential amplifier circuit 513. Voltage values of the reference voltage signals (G) and (H) for the comparators 521 and 522 are made equal to voltage values of the output voltage signals (E) and (F) of the differential amplifier circuit 513 in the case where the output signal (B) of the average value detecting circuit 511 is converged.

Therefore, when the output signal (B) of the average value detecting circuit 511 is in the transient state and reduces, the output signal (I) of the comparator 521 operates as a High-level output signal. When the output signal (B) of the average value detecting circuit 511 is in the transient state and increases, the output signal (J) of the comparator 522 operates as a High-level output signal. The output signals (I) and (J) of the comparators 521 and 522 are AND-operated by the AND logic circuit 523. Thus, in the case of the transient state in which the output signal (B) of the average value detecting circuit 511 does not converge to the constant voltage, even when the output signal (B) of the average value detecting circuit 511 reduces or increases, the time constant switching control circuit 5 operates so as to output a High-level signal.

Figure 6:
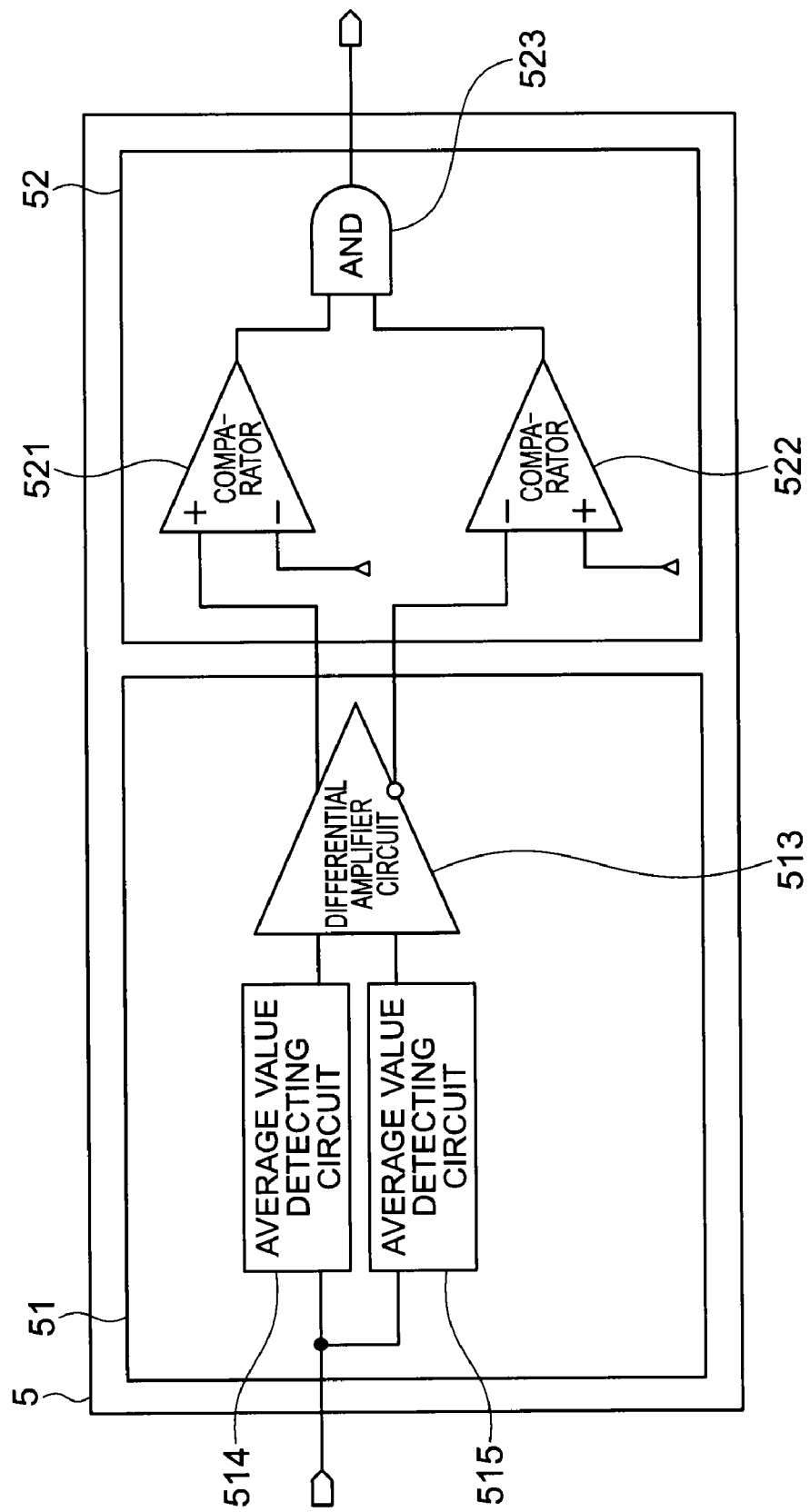
FIG. 6 A block diagram illustrating specific structural examples of the convergence state determination circuit 51 and the time constant switching signal generation logic circuit 52 illustrated in FIG. 3, which is different from FIG. 4.

FIG. 6 is a block diagram illustrating specific structural examples of the convergence state determination circuit 51 and the time constant switching signal generation logic circuit 52 which are different from those illustrated in FIG. 4. The time constant switching signal generation logic circuit 52 is equal to the example illustrated in FIG. 4, and hence the description is omitted. In FIG. 6, the convergence state determination circuit 51 includes: two average value detecting circuits 514 and 515 which are located at the input stage and have different time constants; and a differential amplifier circuit 516 located at the subsequent stage. Assume that a time constant of the average value detecting circuit 515 is shorter than a time constant of the average value detecting circuit 514. A time constant of the average value detecting circuit 514 is equal to the short time constant of the level detecting unit 31 of the level detecting circuit 3.

Figure 7:
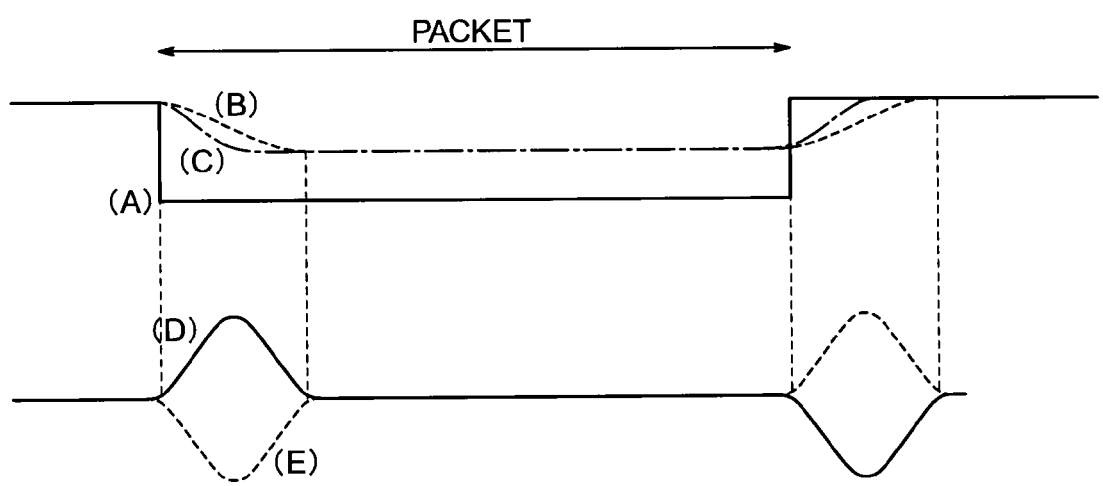
FIG. 7 A timing chart illustrating signal waveforms of respective units of FIG. 6.

FIG. 7 is a timing chart illustrating signal waveforms of the respective units of FIG. 6. In FIG. 7, (A) illustrates an input signal of the average value detecting circuits 514 and 515, (B) illustrates an output signal of the average value detecting circuit 514, (C) illustrates an output signal of the average value detecting circuit 515, and (D) and (E) illustrate output signals of the differential amplifier circuit 516.

The operation and feature of the optical receiver according to Embodiment 2 of the present invention are described with reference to FIG. 7.

The time constant of the average value detecting circuit 514 is longer than the time constant of the average value detecting circuit 515. Therefore, in FIG. 7, a convergence time of the output signal (B) of the average value detecting circuit 514 is later than a convergence time of the output signal (C) of the average value detecting circuit 515, and hence a time lag occurs. The differential amplifier circuit 516 receives, as input signals, the output signal (B) of the average value detecting circuit 514 and the output signal (C) of the average value detecting circuit 515, and outputs an amplitude corresponding to a potential difference between the output signal (B) of the average value detecting circuit 514 and the output signal (C) of the average value detecting circuit 515 in a case where there is the potential difference between the output signal (B) of the average value detecting circuit 514 and the output signal (C) of the average value detecting circuit 515, that is, in a case of only a transient state in which the output signal (B) of the average value detecting circuit 514 does not converge to the constant voltage. The time constant switching signal generation logic circuit 52 operates as described above, and thus operates so as to output a High-level signal even when the output signal (B) of the average value detecting circuit 514 reduces or increases during the transient state in which the output signal (B) of the average value detecting circuit 514 does not converge to the constant voltage.

As described above, according to the optical receiver in Embodiment 2 of the present invention, the convergence state of the AGC operation which is determined based on the time constant of the level detecting circuit 3 can be determined by the convergence state determination circuit 51. Therefore, the switching between the level detection with the short time constant in the case where the AGC operation is not converged and the level detection with the long time constant after the convergence of the AGC operation can be controlled. Thus, it is possible to realize an optical receiver which has a wide-dynamic range characteristic to stably reproduce a packet having different light receiving levels and which is excellent in high-speed responsiveness and identical code continuation resistance.

Embodiment 3

Figure 8:
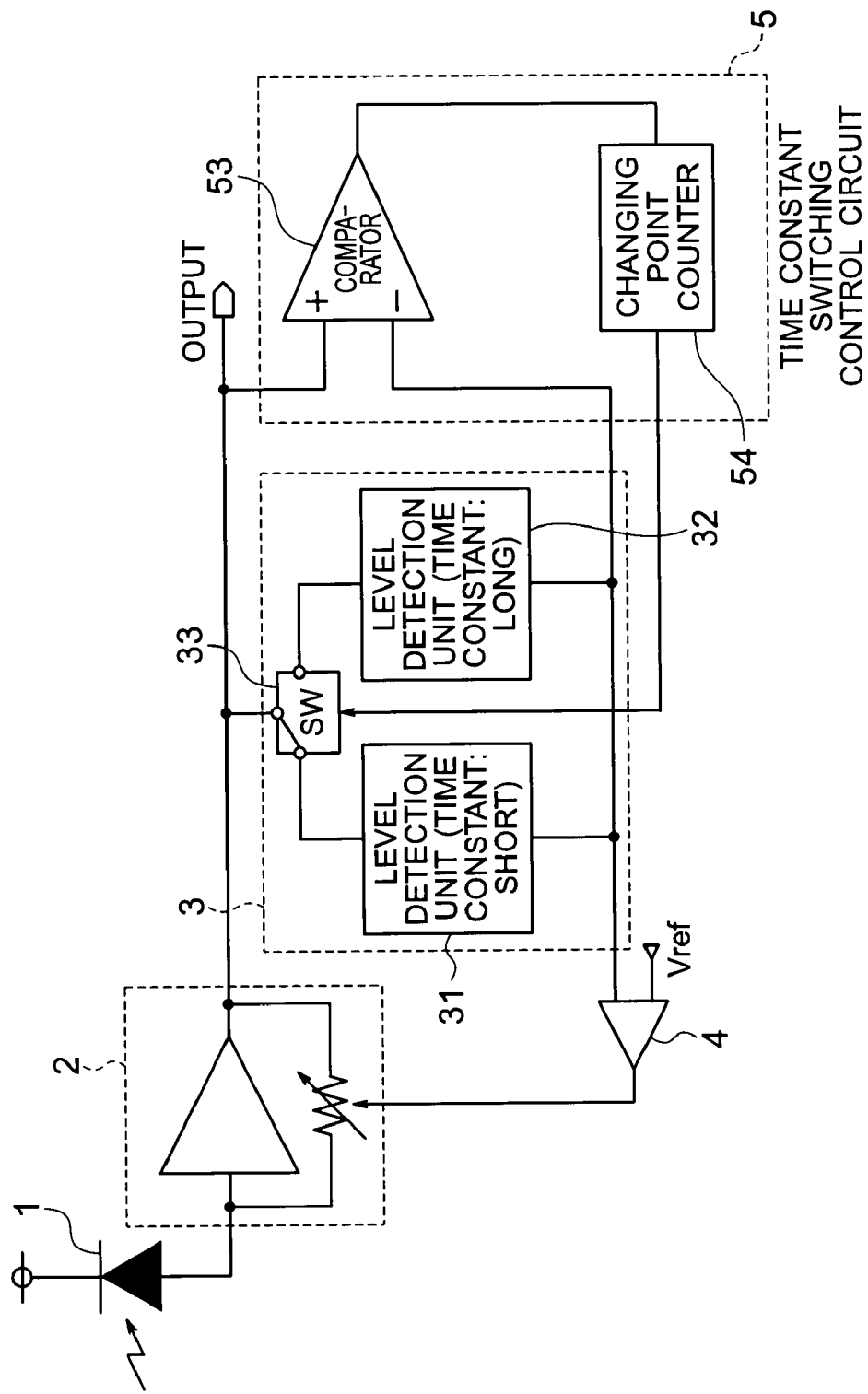
FIG. 8 A block diagram illustrating a structure of an optical receiver according to Embodiment 3 of the present invention.

FIG. 8 is a block diagram illustrating a structure of an optical receiver according to Embodiment 3 of the present invention. In the structure according to Embodiment 3 as illustrated in FIG. 8, the same units as the structure according to Embodiment 1 as illustrated in FIG. 1 and the structure according to Embodiment 2 as illustrated in FIG. 3 are expressed by the same symbols and thus the description is omitted. In Embodiment 3 as illustrated in FIG. 8, the structure of the time constant switching control circuit 5 is different from those in Embodiments 1 and 2. In the structure according to Embodiment 3 as illustrated in FIG. 8, the time constant switching control circuit 5 includes: a comparator 53 which receives, as inputs, the voltage signal output from the preamplifier 2 and the voltage signal output from the level detecting circuit 3; and a changing point counter 54 for counting the number of changing points of a voltage signal output from the comparator 53.

Figure 9:
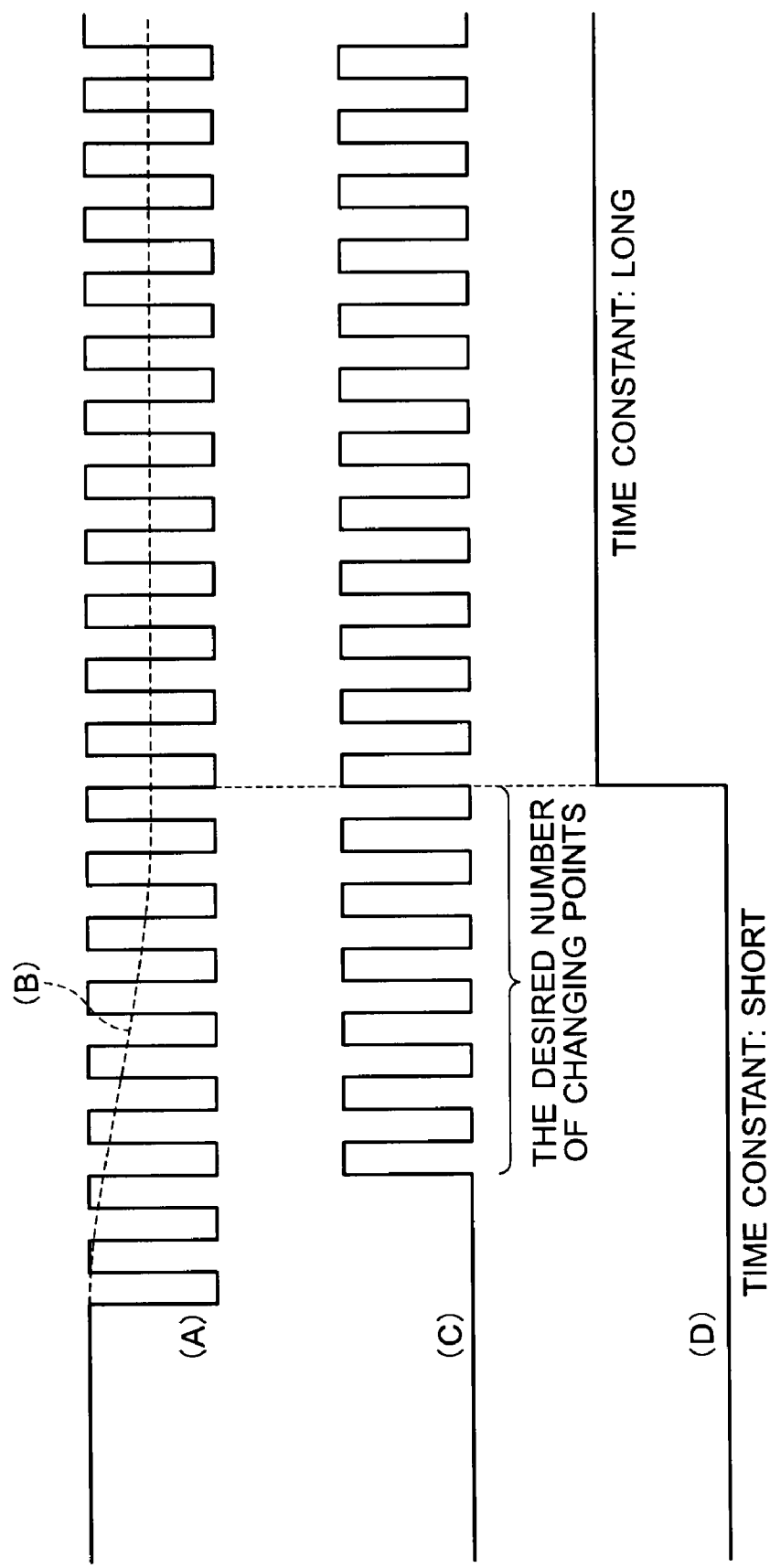
FIG. 9 A timing chart illustrating signal waveforms of respective units of FIG. 8.

FIG. 9 is a timing chart illustrating signal waveforms of the respective units of FIG. 8. In FIG. 9, (A) illustrates the output signal of the preamplifier 2, (B) illustrates the output signal of the level detecting circuit 3, (C) illustrates the output signal of the comparator 53, and (D) illustrates an output signal of the changing point counter 54.

The operation and feature of the optical receiver according to Embodiment 3 of the present invention are described with reference to FIG. 9.

The output signal (A) of the preamplifier 2 and the output signal (B) of the level detecting circuit 3 are input to the comparator 53. The output signal (B) of the level detecting circuit 3 changes to converge to an average value of the output signal (A) of the preamplifier 2 in response to the time constant of the level detecting circuit 3. Therefore, after the packet of the burst signal is input, as the output signal (B) of the level detecting circuit 3 approaches the average value of the output signal (A) of the preamplifier 2, the output signal (C) of the comparator 53 operates for outputting a signal having a pattern string equal to a pattern string of the output signal (A) of the preamplifier 2. The changing point counter 54 operates to change the output signal from a low-level side to a high-level side or from a high-level side to a low-level side when the desired member of changing points is counted.

A period during which the AGC operation is converged by the level detecting unit 31 having the short time constant in the level detecting circuit 3 is made equal to a period during which the changing point counter 54 counts the desired number of changing points. Therefore, after the convergence of the AGC operation, the time constant of the level detecting circuit 3 can be switched from the short time constant to the long time constant.

As described above, the optical receiver according to Embodiment 3 of the present invention includes the comparator 53 which receives, as the input signals, the output voltage of the preamplifier 2 and the output voltage of the level detecting circuit 3, and the changing point counter 54 for counting the changing points of the output signal of the comparator 53. The period during which the AGC operation is converged by the level detecting unit 31 having the short time constant in the level detecting circuit 3 is made equal to the period during which the changing point counter 54 counts the desired number of changing points. Thus, it is possible to realize an optical receiver which has a wide-dynamic range characteristic to stably reproduce a packet having different light receiving levels and which is excellent in high-speed response with long consecutive identical digit signals.

Embodiment 4

Figure 10:
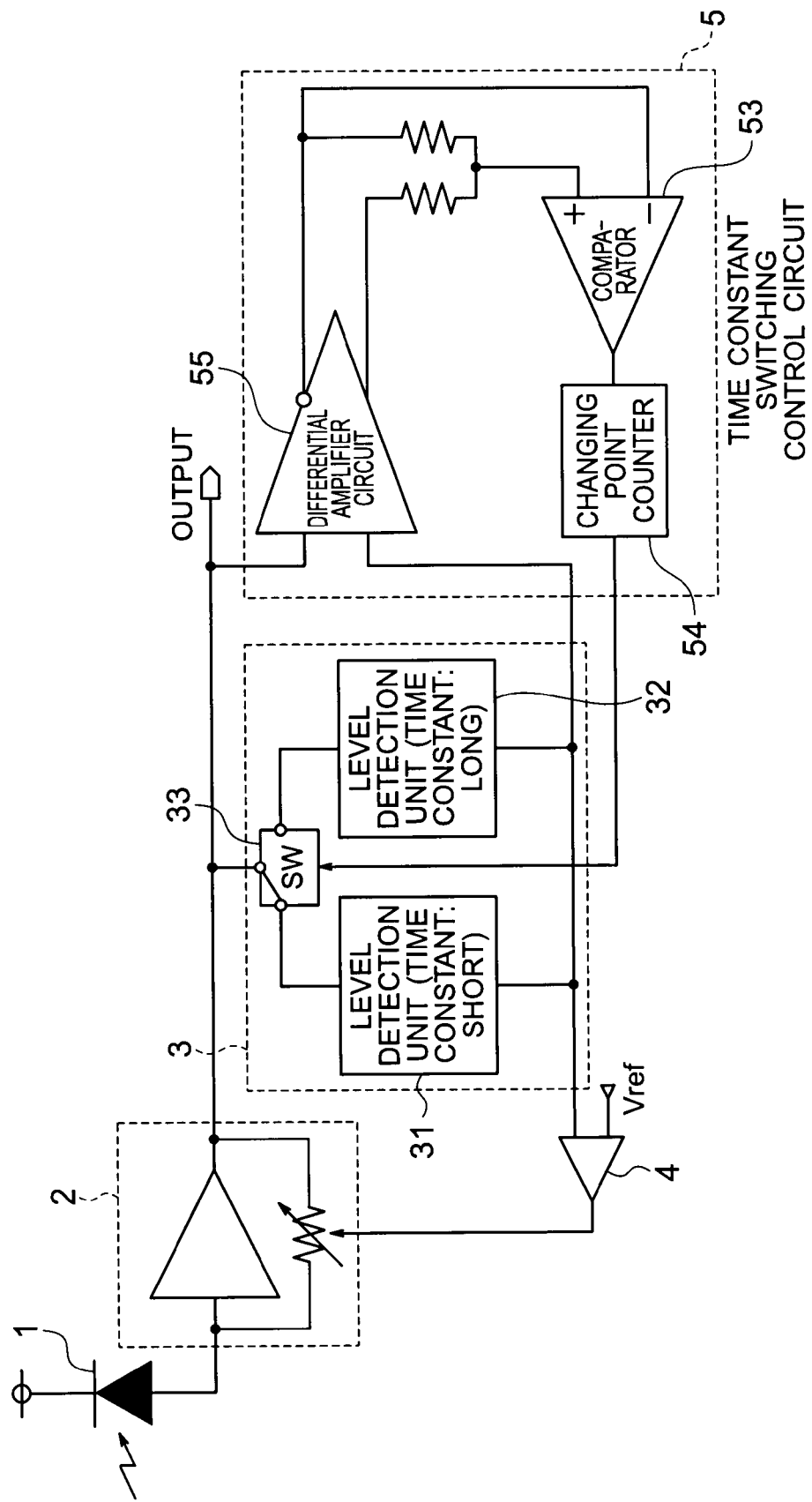
FIG. 10 A block diagram illustrating a structure of an optical receiver according to Embodiment 4 of the present invention.

FIG. 10 is a block diagram illustrating a structure of an optical receiver according to Embodiment 4 of the present invention. In the structure according to Embodiment 4 as illustrated in FIG. 10, the same units as those of the structure according to Embodiment 3 as illustrated in FIG. 8 are expressed by the same symbols and thus the description thereof is omitted. Embodiment 4 is identical to Embodiment 3 in that the time constant switching control circuit 5 illustrated in FIG. 10 has a structure including the comparator 53 and the changing point counter 54. The different point therebetween is that a differential amplifier circuit 55 which receives, as input signals, the output signal of the preamplifier 2 and the output signal of the level detecting circuit 3 is further provided at the preceding stage of the comparator 53, and that any one of a positive-phase output signal and a negative-phase output signal of the differential amplifier circuit 55 and an intermediate potential between the positive-phase output signal and the negative-phase output signal are signals input to the comparator 53.

Figure 11:
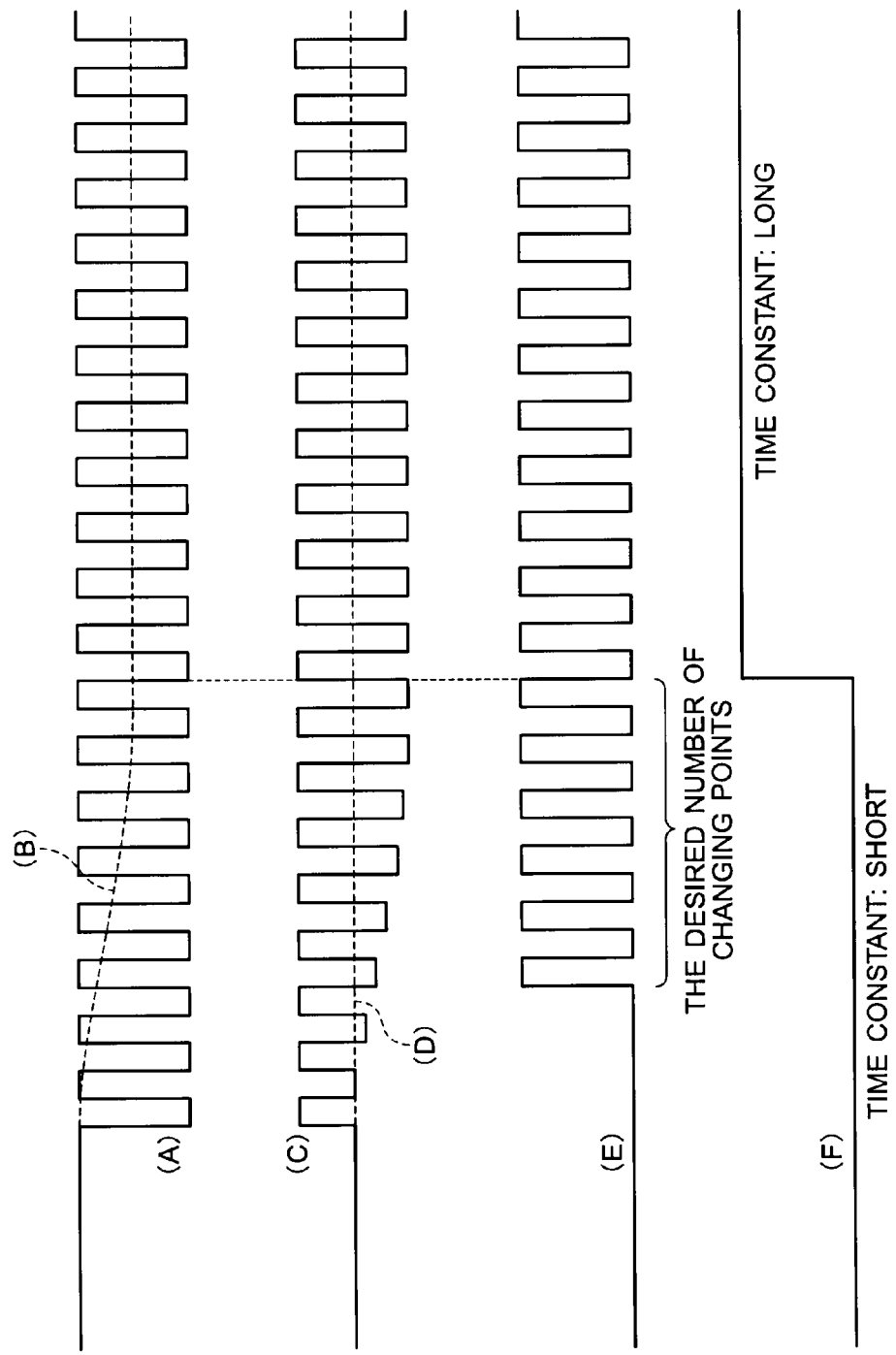
FIG. 11 A timing chart illustrating signal waveforms of respective units of FIG. 10.

FIG. 11 is a timing chart illustrating signal waveforms of the respective units of FIG. 10. In FIG. 11, (A) illustrates the output signal of the preamplifier 2, (B) illustrates the output signal of the level detecting circuit 3, (C) illustrates one of the output signals of the differential amplifier circuit 55, (D) illustrates a differential output intermediate potential of the differential amplifier circuit 55, (E) illustrates the output signal of the comparator 53, and (F) illustrates the output signal of the changing point counter 54.

The fundamental operation is similar to that of Embodiment 3. The different point is that the output signal of the preamplifier 2 is not directly input to the comparator 53 but the output signal (A) of the preamplifier 2 and the output signal (B) of the level detecting circuit 3 are amplified by the differential amplifier circuit 55 and then an amplified output is input to the comparator 53, and that the reference voltage for the comparator 53 is the differential output intermediate potential of the differential amplifier circuit 55.

When a light receiving level of a light signal received by the light receiving element 1 is small, an output amplitude of the preamplifier 2 is also small. Therefore, in the structure according to Embodiment 3, the comparator 53 cannot discriminate the amplitude and thus may malfunction. In contrast to this, in the structure according to Embodiment 4, the differential amplifier circuit 55 is provided at the preceding stage of the comparator 53, whereby an amplified output amplitude of the preamplifier 2 is input to the comparator 53. Thus, there is an advantage that the comparator 53 stably operates even when the light receiving level of the light signal received by the light receiving element 1 is small.

The differential output intermediate potential of the differential amplifier circuit 55 is continuously a constant potential irrespective of the receiving level, and is an average value of the output signal of the differential amplifier circuit 55. Therefore, when the potential is used as the reference voltage for the comparator 53, the same output signal of the comparator 53 as that of Embodiment 3 is obtained.

As described above, in the optical receiver according to Embodiment 4 of the present invention, the differential amplifier circuit 55 is provided at the input stage of the time constant switching control circuit 5 and the amplified output voltage of the preamplifier 2 is input to the comparator 53, and hence stable operation can be achieved even when the receiving level is small. Thus, it is possible to realize an optical receiver which has a wide-dynamic range characteristic to stably reproduce a packet having different light receiving levels and which is excellent in high-speed response with long consecutive identical digit signals.

Embodiment 5

Figure 12:
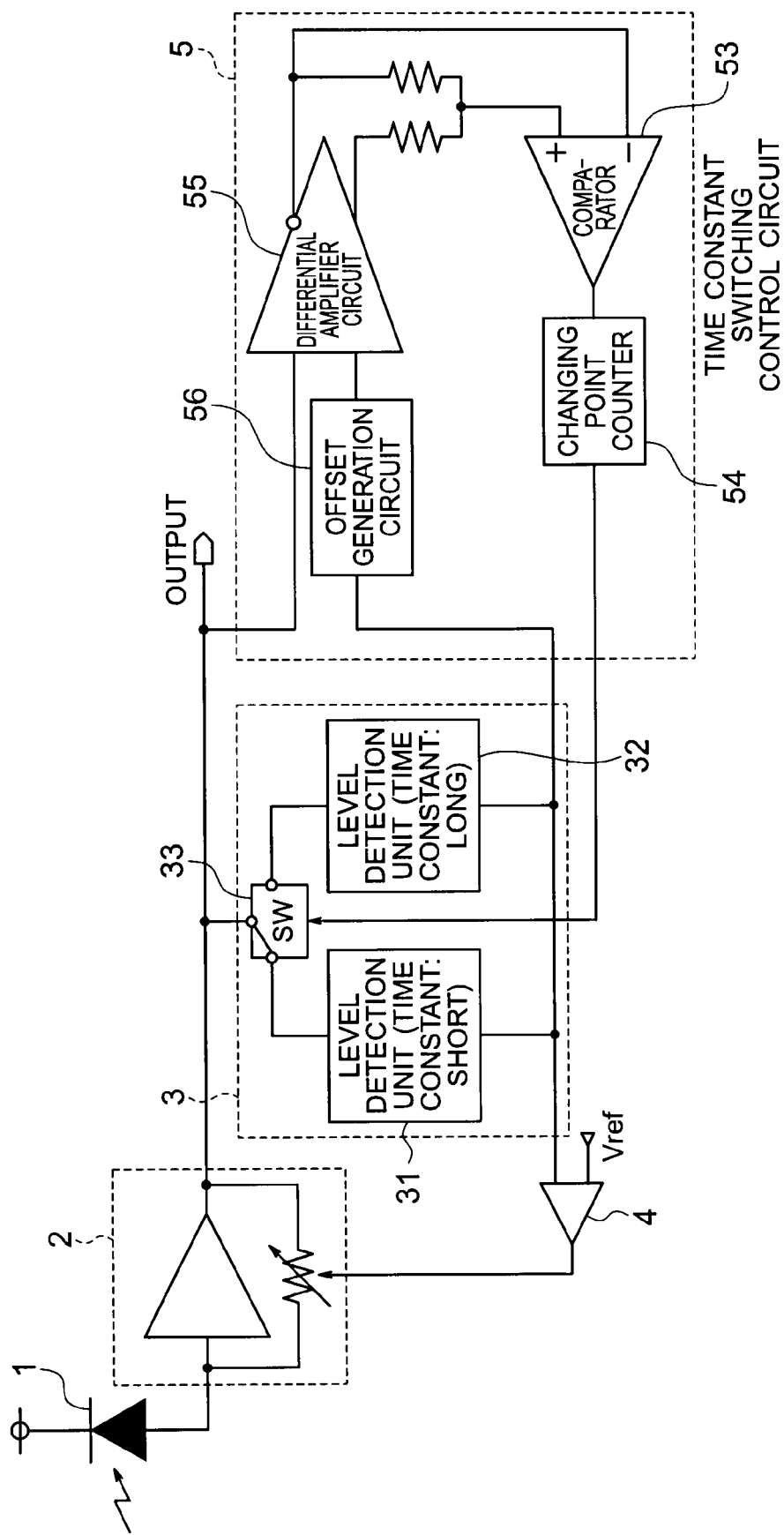
FIG. 12 A block diagram illustrating a structure of an optical receiver according to Embodiment 5 of the present invention.

FIG. 12 is a block diagram illustrating a structure of an optical receiver according to Embodiment 5 of the present invention. In the structure according to Embodiment 5 as illustrated in FIG. 12, the same units as those of the structure according to Embodiment 4 as illustrated in FIG. 10 are expressed by the same symbols and thus the description thereof is omitted. Embodiment 5 is identical to Embodiment 4 in that the time constant switching control circuit 5 illustrated in FIG. 12 has a structure including the differential amplifier circuit 55, the comparator 53, and the changing point counter 54. The different point therebetween is that an offset generation circuit 56 is further provided at the input stage of the differential amplifier circuit 55.

In the case of Embodiment 4, when no signal is input, the input signals of the differential amplifier circuit 55 have the same potential. Therefore, in particular, when the gain of the differential amplifier circuit 55 is high, it is likely to generate noise on the output signal of the differential amplifier circuit 55, whereby the time constant switching control circuit 5 may malfunction. In Embodiment 5 of the present invention, the offset generation circuit 56 is provided at the input stage of the differential amplifier circuit 55. Thus, even when no signal is input, a potential difference is caused between the input signals of the differential amplifier circuit 55, with the result that no noise is generated on the output signal of the differential amplifier circuit.

As described above, in the optical receiver according to Embodiment 5 of the present invention, the offset generation circuit 56 is provided so as to continuously cause the potential difference between the input signals of the differential amplifier circuit 55 located at the input stage of the time constant switching control circuit 5. Therefore, even in the case where no signal is input, such as a case where a packet of a burst signal is not received, stable operation can be achieved. Thus, it is possible to realize an optical receiver which has a wide-dynamic range characteristic to stably reproduce a packet having different light receiving levels and which is excellent in high-speed response with long consecutive identical digit signals.

Embodiment 6

Figure 13:
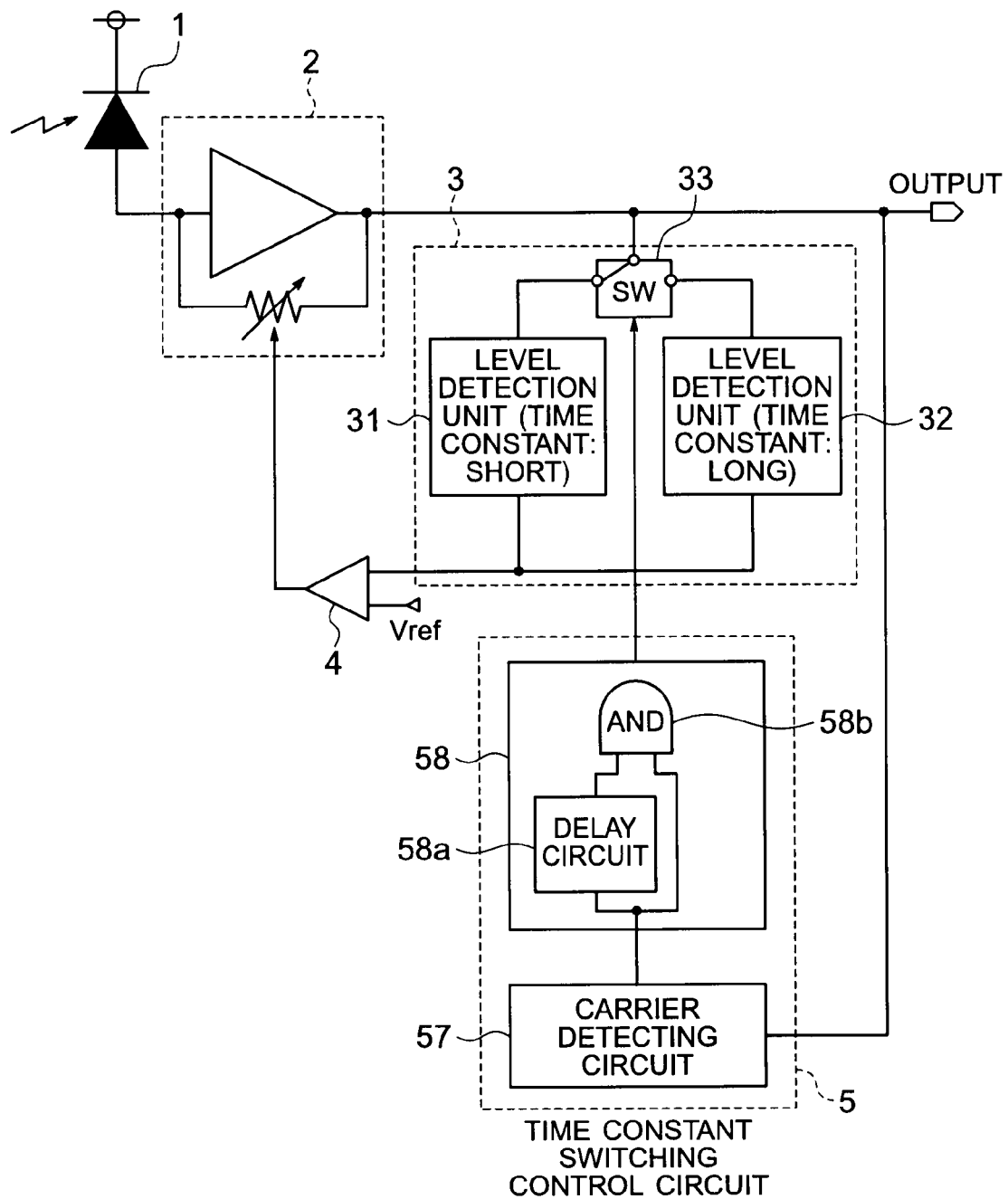
FIG. 13 A block diagram illustrating a structure of an optical receiver according to Embodiment 6 of the present invention.

FIG. 13 is a block diagram illustrating a structure of an optical receiver according to Embodiment 6 of the present invention. In the structure according to Embodiment 6 as illustrated in FIG. 13, the same units as those of the structure according to Embodiment 1 as illustrated in FIG. 1 are expressed by the same symbols and thus the description thereof is omitted. In Embodiment 6, the time constant switching control circuit 5 illustrated in FIG. 13 includes a carrier detecting circuit 57 and a time constant switching signal generation logic circuit 58 which includes a delay circuit 58a for generating a time constant switching signal based on a result obtained by detection by the carrier detecting circuit 57 and an AND logic circuit 58b for ANDing an output signal of the carrier detecting circuit 57 and an output signal of the delay circuit 58a. A delay time generated by the delay circuit 58a is equal to the time constant of the level detecting unit 31 having the short time constant in the level detecting circuit 3.

Figure 14:
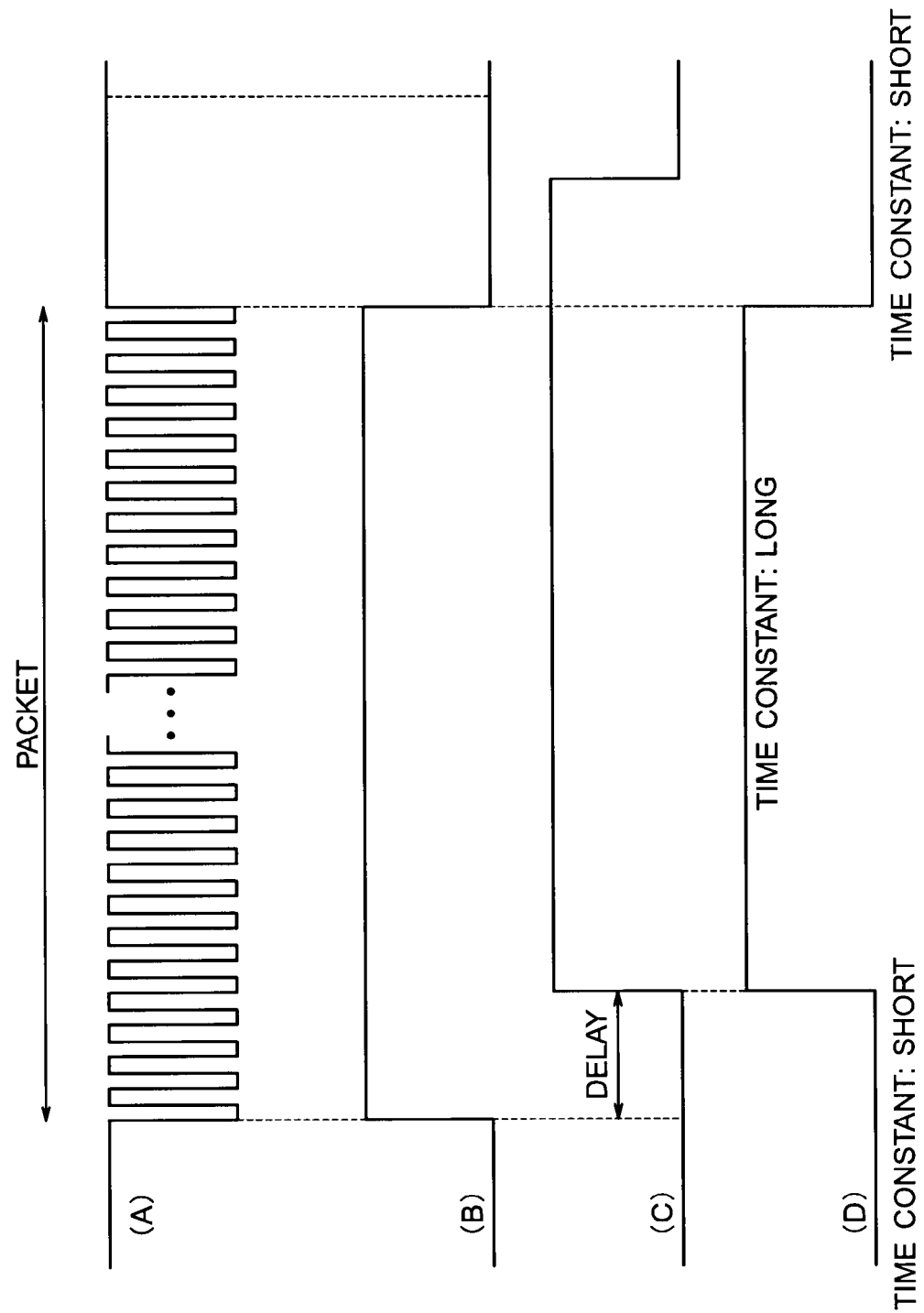
FIG. 14 A timing chart illustrating signal waveforms of respective units of FIG. 13.

FIG. 14 is a timing chart illustrating signal waveforms of the respective units of FIG. 13. In FIG. 14, (A) illustrates the output signal of the preamplifier 2, (B) illustrates the output signal of the carrier detecting circuit 57, (C) illustrates an output signal of the delay circuit 58a for delaying the output signal of the carrier detecting circuit 57 by a desired time, and (D) illustrates an output signal of the AND logic circuit 58b which logically operates the output signal (B) of the carrier detecting circuit 57 and the output signal (C) of the delay circuit 58a.

When a signal of the output signal (D) of the AND logic circuit 58b is in a low level, the level detecting circuit 3 is controlled so as to operate as the level detecting unit 31 having the short time constant. When a signal of the output signal (D) of the AND logic circuit 58b is in a high level, the level detecting circuit 3 is controlled so as to operate with the long time constant. Therefore, the switching between the level detection with the short time constant in the case where the AGC operation is not converged and the level detection with the long time constant after the convergence of the AGC operation can be controlled.

As described above, in the optical receiver according to Embodiment 6 of the present invention, the time constant switching control circuit 5 includes the carrier detecting circuit 57 and the delay circuit 58a having a delay amount equal to the short time constant of the level detecting unit 31 of the level detecting circuit 3. Therefore, the switching between the level detection with the short time constant in the case where the AGC operation is not converged and the level detection with the long time constant after the convergence of the AGC operation can be controlled. Thus, it is possible to realize an optical receiver which has a wide-dynamic range characteristic to stably reproduce a packet having different light receiving levels and which is excellent in high-speed response with long consecutive identical digit signals.

Embodiment 7

Figure 15:
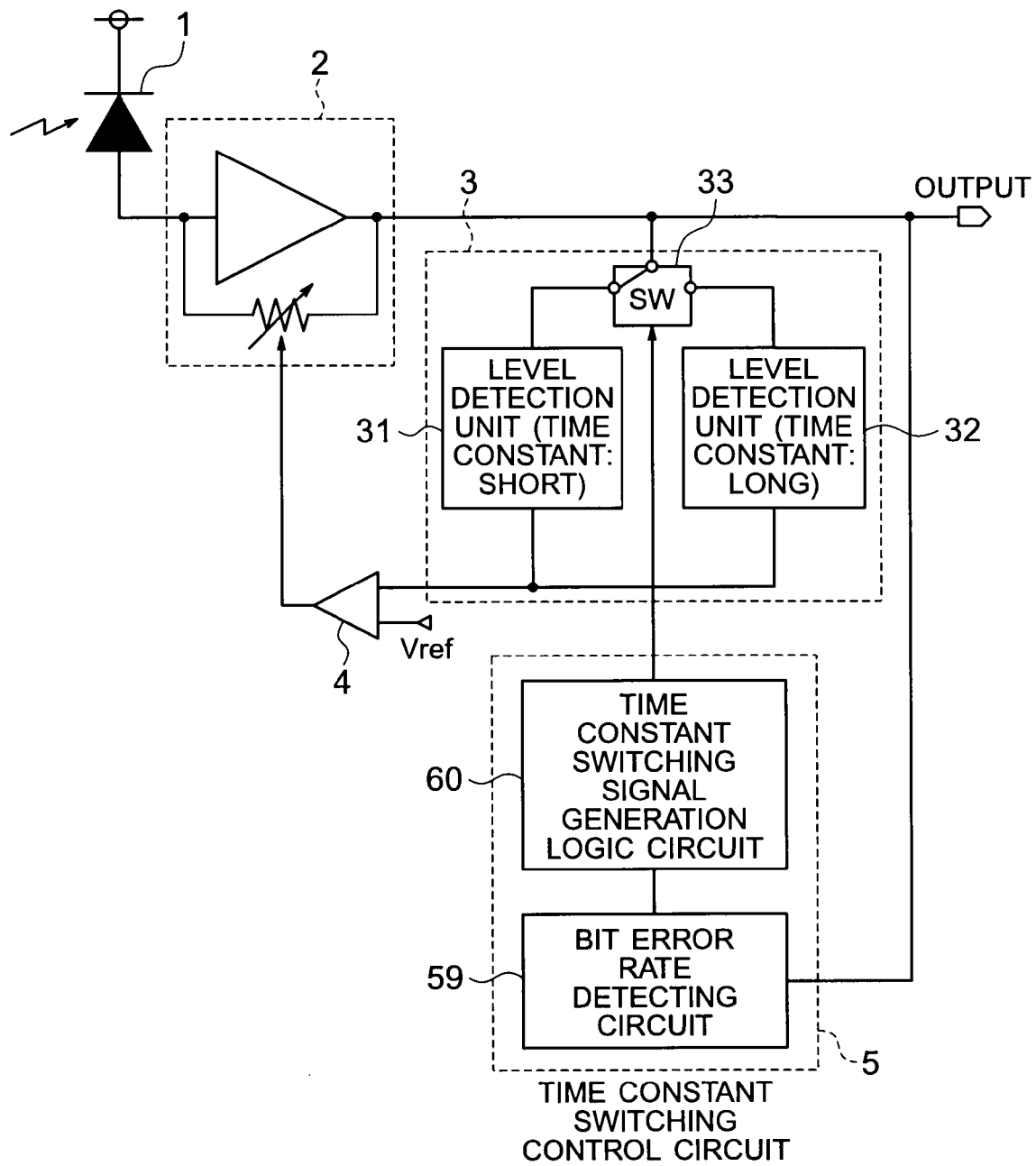
FIG. 15 A block diagram illustrating a structure of an optical receiver according to Embodiment 7 of the present invention.

FIG. 15 is a block diagram illustrating a structure of an optical receiver according to Embodiment 7 of the present invention. In the structure according to Embodiment 7 as illustrated in FIG. 15, the same units as those of the structure according to Embodiment 1 as illustrated in FIG. 1 are expressed by the same symbols and thus the description thereof is omitted. In Embodiment 7, the time constant switching control circuit 5 illustrated in FIG. 15 includes: a bit error rate detecting circuit 59 for detecting a bit error rate of a receiving signal in real time using, as a threshold, the result obtained by detection by the level detecting circuit 3; and a time constant switching signal generation logic circuit 60 for generating a time constant switching signal based on a result obtained by detection by the bit error rate detecting circuit 59.

In the first part of a packet of a burst signal, the output signal of the level detecting circuit 3 is put on the high-level side of the output signal of the preamplifier 2 and reaches the average voltage of the output signal of the preamplifier 2 with the lapse of time. Therefore, when the bit error rate of the output signal of the preamplifier 2 is evaluated using the output signal of the level detecting circuit 3 as the threshold, the bit error rate in the first part of the packet of the burst signal is very large, whereas the bit error rate becomes very small along with the approach to an optimum threshold with the lapse of time. That is, the convergence state of the AGC operation can be determined based on the detected error bit rate.

Therefore, in the optical receiver according to Embodiment 7 of the present invention, the time constant is controlled by the time constant switching control circuit 5 such that the level detection with the short time constant is performed when the bit error rate is larger than the desired error bit rate and that the level detection with the long time constant is performed when the bit error rate is smaller than the desired error bit rate. Thus, it is possible to realize an optical receiver which has a wide-dynamic range characteristic to stably reproduce a packet having different light receiving levels and which is excellent in high-speed response with long consecutive identical digit signals.

The invention claimed is:

1. An optical receiver, comprising:
a light receiving element for outputting a current corresponding to a light receiving level of a received light signal;
a preamplifier for converting an output current signal from the light receiving element into a voltage signal;
level detecting means including:
a first level detecting unit having a short time constant; and
a second level detecting unit having a time constant longer than the time constant of the first level detecting unit,
the level detecting means switching over to any one of the first level detecting unit and the second level detecting unit in response to a time constant switching signal to detect a voltage level of an output voltage signal output from the preamplifier;
conversion gain control means for variably controlling a conversion gain of the preamplifier based on a result obtained by the detecting by the level detection means; and
time constant switching control means for outputting the time constant switching signal based on the output voltage signal from the preamplifier,
wherein the time constant switching control means outputs the time constant switching signal to the level detecting means so as to select the first level detecting unit when a number of consecutive identical digits of a bit string of a packet of a received burst signal is smaller than a predetermined number, and so as to select the second level detecting unit when the number of consecutive identical digits is equal to or larger than the predetermined number.

2. An optical receiver according to claim 1, wherein the time constant switching control means includes:
a convergence state determination circuit for determining whether or not a voltage value of the output voltage signal from the preamplifier converges to a constant voltage; and
a time constant switching signal generation logic circuit for generating the time constant switching signal based on a result obtained by the determining by the convergence state determination circuit.

3. An optical receiver according to claim 2, wherein the convergence state determination circuit includes:
an average value detecting circuit having a time constant equal to the time constant of the first level detecting unit, for detecting an average value of the output voltage signal from the preamplifier;
a differentiating circuit for differentiating an output signal from the average value detecting circuit; and
a differential amplifier circuit for detecting a difference voltage between an output signal from the differentiating circuit and a reference voltage.

4. An optical receiver according to claim 2, wherein the convergence state determination circuit includes:
a first average value detecting circuit having a time constant equal to the time constant of the first level detecting unit, for detecting an average value of the output voltage signal from the preamplifier;
a second average value detecting circuit having a time constant shorter than the time constant of the first average value detecting circuit, for detecting the average value of the output voltage signal from the preamplifier; and
a differential amplifier circuit for detecting a difference voltage between an output signal from the first average value detecting circuit and an output signal from the second average value detecting circuit.

5. An optical receiver according to claim 3, wherein the time constant switching signal generation logic circuit includes:

a first comparator for comparing a first output signal from the differential amplifier circuit with a first reference voltage signal;

a second comparator for comparing a second output signal from the differential amplifier circuit with a second reference voltage signal; and an AND logic circuit for generating the time constant switching signal based on an AND of an output signal from the first comparator and an output signal from the second comparator.

6. An optical receiver according to claim 2, wherein the time constant switching control means includes:

a comparator for comparing the output voltage signal from the preamplifier and the result obtained by the detecting by the level detection means; and a changing point counter for counting a changing point of a pattern string based on a result obtained by the comparing by the comparator and outputting the time constant switching signal when the desired number of changing points is counted.

7. An optical receiver according to claim 2, wherein the time constant switching control means includes:

a differential amplifier circuit for detecting a difference voltage between the output voltage signal from the preamplifier and the result obtained by the detecting by the level detection means;

a comparator for comparing an output voltage signal from the differential amplifier circuit and an output intermediate potential from the differential amplifier circuit; and a changing point counter for counting a changing point of a pattern string based on a result obtained by the comparing and outputting the time constant switching signal when the desired number of changing points is counted.

8. An optical receiver according to claim 7, wherein an offset generation circuit for causing a voltage difference between two input signals of the differential amplifier circuit in any condition is provided at an input stage for the result obtained by the detecting by the level detection means, of the differential amplifier circuit.

9. An optical receiver according to claim 2, wherein the time constant switching control means includes:

a carrier detecting circuit for detecting a carrier from the output voltage signal output from the preamplifier; and a time constant switching signal generation logic circuit including:

a delay circuit for delaying, by a desired time, a result obtained by the detecting by the carrier detecting circuit; and an AND logic circuit for generating the time constant switching signal based on an AND of the result obtained by the detecting by the carrier detecting circuit and an output signal from the delay circuit.

10. An optical receiver according to claim 9, wherein the delay circuit has a delay time equal to the time constant of the first level detecting unit.

11. An optical receiver according to claim 2, wherein the time constant switching control means includes:

a bit error rate detecting circuit for detecting a bit error rate of the output voltage signal output from the preamplifier using, as a threshold, the result obtained by the detecting by the level detection means; and a time constant switching signal generation logic circuit for generating the time constant switching signal based on a result obtained by the detecting by the bit error rate detecting circuit.

12. An optical receiver according to claim 4, wherein the time constant switching signal generation logic circuit includes:

a first comparator for comparing a first output signal from the differential amplifier circuit with a first reference voltage signal;

a second comparator for comparing a second output signal from the differential amplifier circuit with a second reference voltage signal; and an AND logic circuit for generating the time constant switching signal based on an AND of an output signal from the first comparator and an output signal from the second Comparator.

* * * * *